(12) United States Patent
Jeon et al.

(10) Patent No.: US 7,632,709 B2
(45) Date of Patent: Dec. 15, 2009

(54) METHOD OF MANUFACTURING WAFER LEVEL PACKAGE

(75) Inventors: Hyung-Jin Jeon, Gunpo-si (KR); Sung Yi, Suwon-si (KR); Young-Do Kweon, Seoul (KR); Jong-Yun Lee, Incheon (KR); Joon-Seok Kang, Suwon-si (KR); Seung-Wook Park, Suwon-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 39 days.

(21) Appl. No.: 12/149,106

(22) Filed: Apr. 25, 2008

(65) Prior Publication Data

US 2009/0087951 A1 Apr. 2, 2009

(30) Foreign Application Priority Data

Oct. 2, 2007 (KR) .................. 10-2007-0099228

(51) Int. Cl.
*H01L 21/00* (2006.01)
(52) U.S. Cl. .................. 438/106; 438/108; 438/113; 438/612; 438/613; 438/617; 257/E21.507; 257/E21.508; 257/E21.576; 257/E21.589; 257/E21.705; 257/E23.011; 257/E23.021; 257/E29.069; 257/E25.013
(58) Field of Classification Search ......... 438/106–117, 438/612–617; 257/E21.507, E21.508, E21.576, 257/E21.589, E21.705, E23.011, E23.021, 257/E23.069, E25.013
See application file for complete search history.

(56) References Cited

U.S. PATENT DOCUMENTS

| | | | |
|---|---|---|---|
| 6,181,569 B1 * | 1/2001 | Chakravorty | 361/761 |
| 6,605,525 B2 * | 8/2003 | Lu et al. | 438/617 |
| 6,743,660 B2 * | 6/2004 | Lee et al. | 438/108 |
| 6,784,087 B2 * | 8/2004 | Lee et al. | 438/612 |
| 6,828,175 B2 * | 12/2004 | Wood et al. | 438/113 |
| 6,930,032 B2 * | 8/2005 | Sarihan et al. | 438/614 |
| 6,939,789 B2 * | 9/2005 | Huang et al. | 438/612 |
| 7,115,998 B2 * | 10/2006 | Hiatt et al. | 257/773 |
| 7,122,458 B2 * | 10/2006 | Cheng et al. | 438/612 |
| 7,193,308 B2 * | 3/2007 | Matsui | 257/686 |
| 7,205,660 B2 * | 4/2007 | Park et al. | 257/737 |
| 7,335,986 B1 * | 2/2008 | Paek et al. | 257/723 |
| 7,495,317 B2 * | 2/2009 | Song et al. | 257/659 |
| 7,545,027 B2 * | 6/2009 | Chung et al. | 257/678 |
| 2002/0163069 A1 * | 11/2002 | Lu et al. | 257/690 |

FOREIGN PATENT DOCUMENTS

KR 10-0652443 12/2006

OTHER PUBLICATIONS

Korean Patent Office Action, mailed Jul. 25, 2008, and issued in corresponding Korean Patent Application No. 10-2007-0099228.

* cited by examiner

*Primary Examiner*—Michael S Lebentritt

(57) ABSTRACT

A method of manufacturing a wafer level package is disclosed. The method may include stacking an insulation layer over a wafer substrate; processing a via hole in the insulation layer; forming a seed layer over the insulation layer; forming a plating resist, which is in a corresponding relationship with a redistribution pattern, over the seed layer; forming the redistribution pattern, which includes a terminal for external contact, by electroplating; and coupling a conductive ball to the terminal. As multiple redistribution layers can be formed using inexpensive PCB processes, the manufacturing costs can be reduced, and the stability and efficiency of the process can be increased.

6 Claims, 21 Drawing Sheets

BCB

METHOD OF MANUFACTURING WAFER LEVEL PACKAGE

CROSS-REFERENCE TO RELATED APPLICATIONS

This application claims the benefit of Korean Patent Application No. 10-2007-0099228 filed with the Korean Intellectual Property Office on Oct. 2, 2007, the disclosure of which is incorporated herein by reference in its entirety.

BACKGROUND

1. Technical Field

The present invention relates to a method of manufacturing a wafer level package.

2. Description of the Related Art

In step with the trends in electronic equipment towards lighter, thinner, and smaller products that provide higher performance, the semiconductor chip mounted in a package is becoming smaller in size and larger in capacity. Accordingly, the pads, which are portions positioned on the surface of a semiconductor chip and through which external signals can be delivered, are also decreasing in size and pitch, and are being arranged in various configurations. As such, the process of forming bonding wires for connecting the pads with a printed circuit board is becoming more and more complicated.

To overcome the difficulties in the process for forming bonding wires, a pad redistribution technique has been proposed, with which the positions of pads may be redistributed to a configuration favorable to the process for forming bonding wires. The pad redistribution technique may include sequentially forming over a finished Wafer, an insulation film pattern, a seed metal film, a photosensitive film pattern, and a metal pattern, etc., to redistribute the positions of the pads to the desired positions.

In the case of a low end product, a single-layer redistribution can provide an advantage in cost reduction, but in the case of a high-performance, high-functionality die, because of the numerous I/O (input/output) required, multiple redistribution layers may be needed for electrical connection.

FIG. 1 through FIG. 3 illustrate a wafer level package formed using a semiconductor process according to the related art, for each layer of redistribution. First, as illustrated in FIG. 1, the wafer can be flattened, and a BCB (benzocyclobutene) layer having via holes can be formed, and then, as illustrated in FIG. 2, processes of applying photoresist, exposing, developing, and etching a UBM (under-barrier metal) can be performed, to form a runner that extends from the bonding pad to the new bump pad. Next, as illustrated in FIG. 3, a second BCB layer may be stacked to protect the runner, and then finally, a solder bump may be formed over the wafer.

However, due to the high costs of manufacturing redistribution layers by semiconductor processes, a high manufacturing cost may be required to form multiple redistribution layers, which pose problems in mass production.

SUMMARY

An aspect of the invention provides a method of manufacturing a wafer level package, which can lower the increase in manufacturing costs resulting from expensive redistribution layers formed by semiconductor processes.

Another aspect of the invention provides a method of manufacturing a wafer level package, which includes: stacking an insulation layer over a wafer substrate; processing a via hole in the insulation layer; forming a seed layer over the insulation layer; forming a plating resist, which is in a corresponding relationship with a redistribution pattern, over the seed layer; forming the redistribution pattern, which includes a terminal for external contact, by electroplating; and coupling a conductive ball to the terminal.

Before the stacking of the insulation layer, the method may further include: penetrating a substrate such that a cavity is formed; attaching an adhesion layer onto one side of the substrate; and placing the wafer substrate on one side of the adhesion layer, by inserting the wafer substrate in the cavity.

In certain embodiments, the method may further include, after the attaching of the adhesion layer: forming a carrier layer on the other side of the adhesion layer.

After the forming of the redistribution pattern, the method may further include: removing the plating resist; coating a PSR (photoimageable solder resist) ink, such that the insulation layer and the redistribution pattern including the terminal are covered; and selectively removing the PSR, such that the terminal is exposed.

The method can also include, before the coupling of the conductive ball: forming a passivation layer, which prevents the terminal from oxidizing, over the terminal.

In certain embodiments, an operation of separating the adhesion layer and the carrier layer may be included, before the coupling of the conductive ball.

In the method of manufacturing a wafer level package according to certain embodiments of the invention, multiple redistribution layers can be formed using inexpensive PCB processes, so that process costs may be reduced. After implementing the first redistribution layer using a semiconductor fabrication process, the second layer onwards can be implemented using a PCB process, to increase the stability and efficiency of the manufacturing process.

Additional aspects and advantages of the present invention will be set forth in part in the description which follows, and in part will be obvious from the description, or may be learned by practice of the invention.

DETAILED DESCRIPTION

As the invention allows for various changes and numerous embodiments, particular embodiments will be illustrated in drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed explanations of related art are omitted when it is deemed that they may unnecessarily obscure the essence of the invention.

While such terms as "first" and "second," etc., may be used to describe various elements, such elements must not be limited to the above terms. The above terms are used only to distinguish one element from another.

The terms used in the present application are merely used to describe particular embodiments, and are not intended to limit the present invention. An expression used in the singular encompasses the expression of the plural, unless it has a clearly different meaning in the context. In the present application, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Certain embodiments of the invention will now be described below in more detail with reference to the accompanying drawings.

Figure 1:
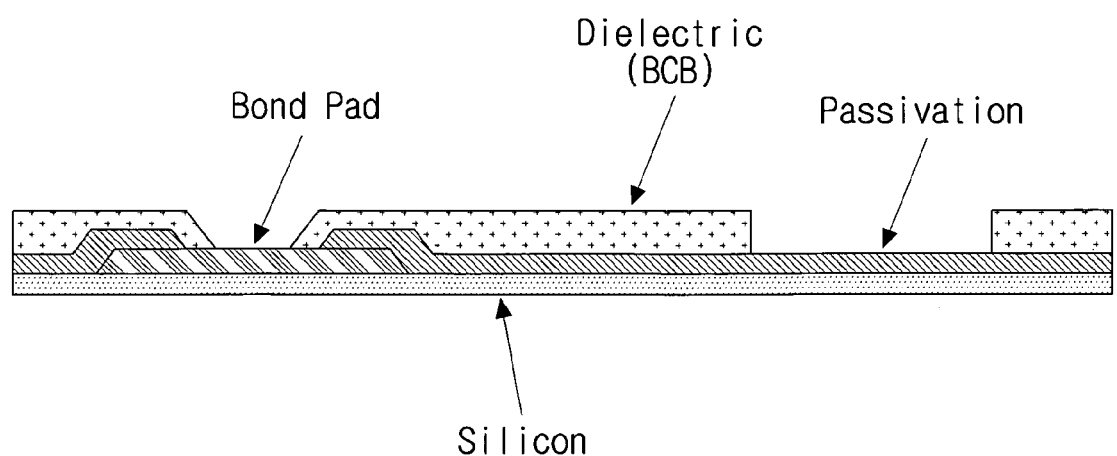
FIG. 1, FIG. 2, and FIG. 3 are drawings illustrating a wafer level package manufactured using a semiconductor process according to the related art.
Figure 2:
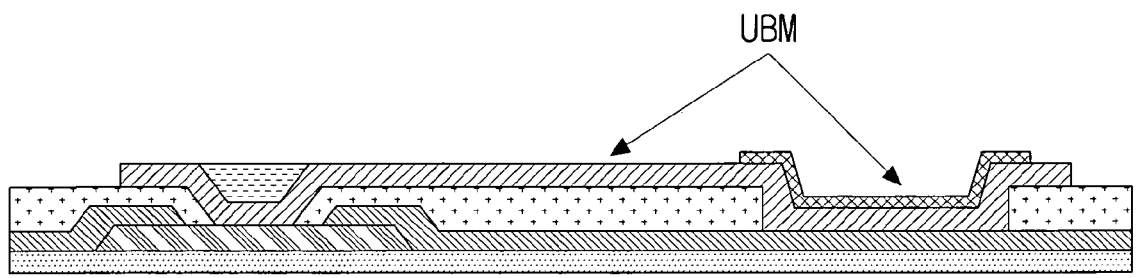
Figure 3:
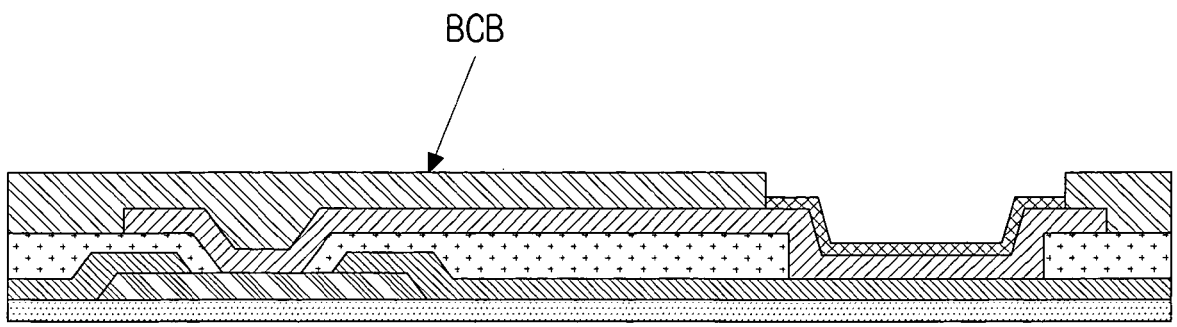
Figure 4:
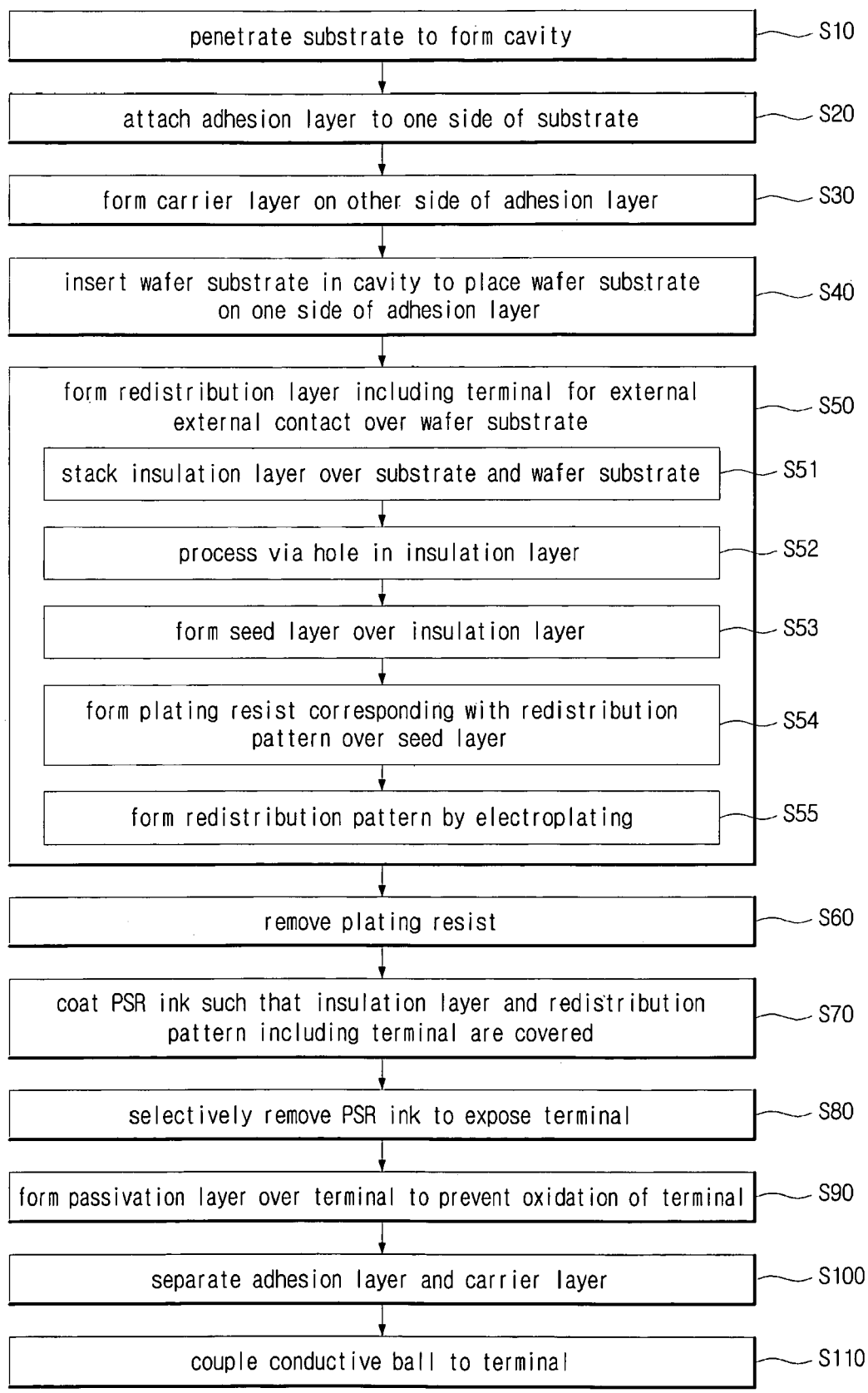
FIG. 4 is a flowchart illustrating a method of manufacturing a wafer level package according to an aspect of the present invention.

FIG. 4 is a flowchart illustrating a method of manufacturing a wafer level package according to an aspect of the invention, and FIG. 5 through FIG. 21 are drawings that represent a method of manufacturing a wafer level package according to an aspect of the invention. In FIGS. 5 to 21, there are illustrated a substrate 10, cavities 11, an adhesion layer 12, a carrier layer 14, a wafer substrate 16, via holes 17, an insulation layer 18, a seed layer 20, a plating resist 22, a redistribution pattern 24, a redistribution layer 25, PSR ink 26, a passivation layer 28, and conductive balls 30.

By utilizing an embodiment of the invention, multiple redistribution layers can be formed using low-cost PCB processes, when manufacturing a wafer level package, to reduce process costs. In a wafer level package having fine-pitch pads that are difficult to implement with PCB processes, a semiconductor fabrication process can be performed for the first redistribution layer, after which a PCB process can be performed for the second redistribution layer onwards, to increase the stability and efficiency of the manufacturing process.

Figure 5:
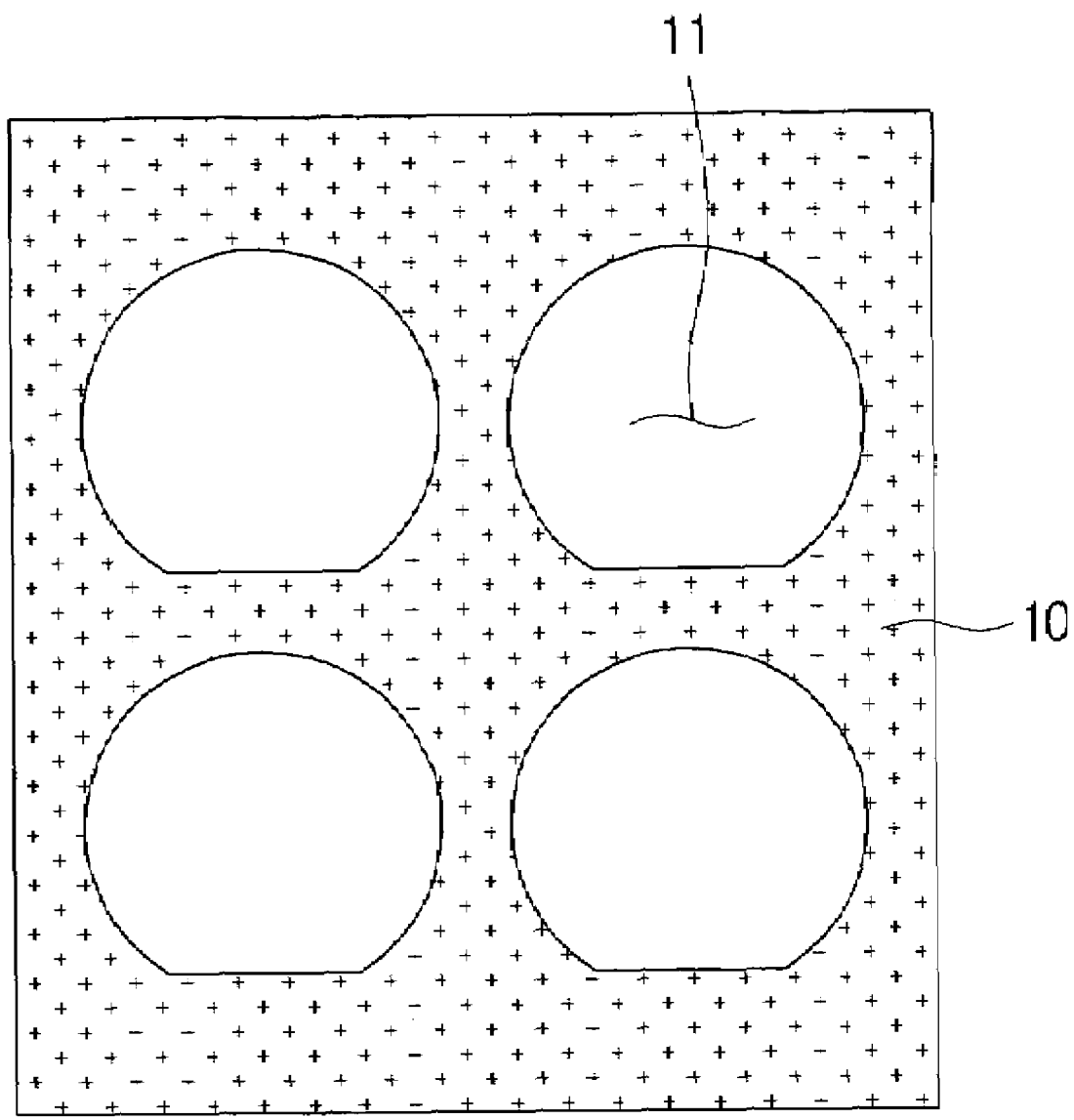
FIG. 5, FIG. 6, FIG. 7, FIG. 8, FIG. 9, FIG. 10, FIG. 11, FIG. 12, FIG. 13, FIG. 14, FIG. 15, FIG. 16, FIG. 17, FIG. 18, FIG. 19, FIG. 20, and FIG. 21 are drawings representing a method of manufacturing a wafer level package according to an aspect of the present invention.

To this end, first, a substrate 10 may be penetrated such that cavities 11 are formed (S10), as illustrated in FIG. 5. The cavities 11 provide spaces in which wafer substrates 16 may be placed, where the shape of the cavities 11 may vary according to the shape of the wafer substrates 16.

The substrate 10 may serve as a frame in which to insert and position the wafer substrates 16. In this particular embodiment, the substrate 10 can be formed from a copper clad laminate, but the invention is not thus limited.

A single cavity 11 can be formed in the substrate 10, or as illustrated in FIG. 5, more than one cavity 11 can be formed in the substrate 10. Forming multiple cavities 11 can improve productivity, and make it easier to mass produce wafer level packages.

However, since the substrate 10 may serve merely as a frame in which to position the wafer substrate 16 as mentioned above, a redistribution pattern 24 can be formed without a substrate 10, by applying a PCB process directly to the wafer substrate 16. In this particular embodiment, a substrate 10 is used, in which a cavity 11 is formed.

Figure 6:
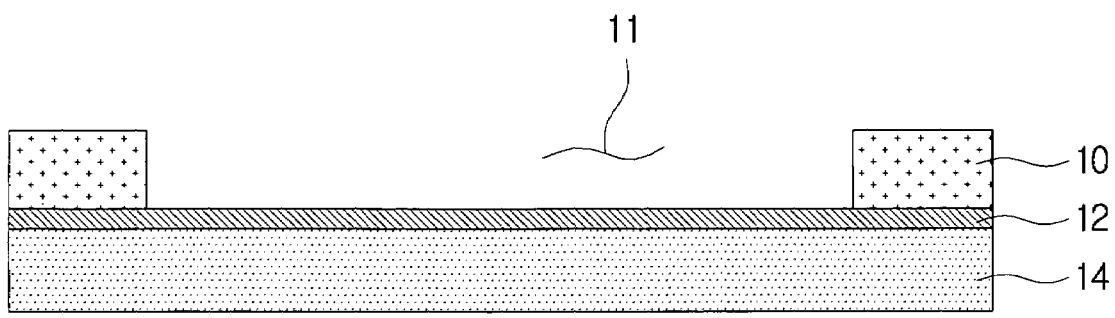

Next, as illustrated in FIG. 6, an adhesion layer 12 may be attached to one side of the substrate 10 (S20), and a carrier layer 14 may be formed on the other side of the adhesion layer 12 (S30). Here, the adhesion layer 12 can be tape, and the carrier layer 14 can be formed from a metal plate capable of supporting the wafer substrate 16. If the wafer substrate 16 is sufficiently light, a metal plate support may not have to be used.

Figure 7:
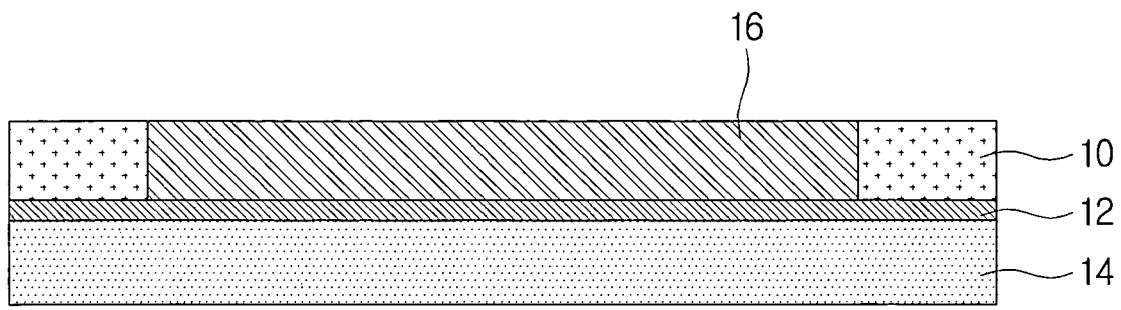

Then, as illustrated in FIG. 7, the wafer substrate 16 can be inserted in the cavity 11, such that the wafer substrate 16 may be placed on one side of the adhesion layer 12 (S40). Here, the wafer substrate 16 can be a wafer substrate 16 that has a first redistribution layer completed by way of a semiconductor process. Here, a wafer substrate 16 having a completed redistribution layer refers to a wafer that includes an active area that can be electrically connected. The wafer substrate 16 can be formed as a die wafer substrate.

For stability in processing chip pads of a fine pitch, the first redistribution layer can be formed by a semiconductor process, and the subsequent redistribution layers can be formed by a PCB process, as already described above.

Of course, in cases where the pitch of the chip pads is sufficiently large, it may be possible to form the first redistribution layer using a PCB process also.

Figure 8:
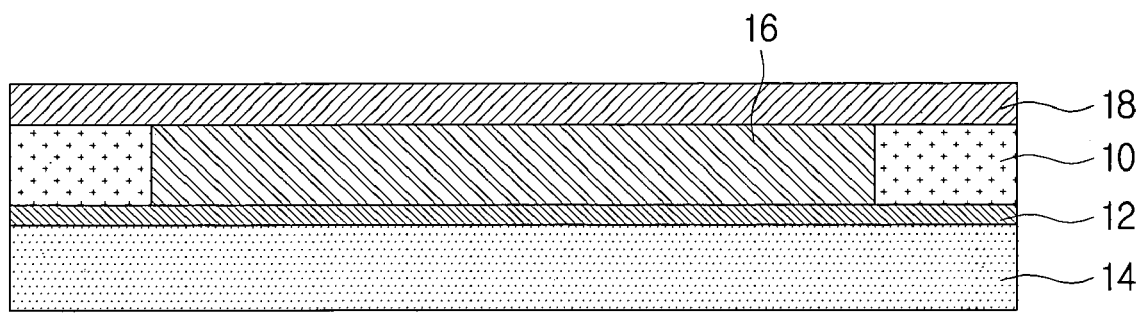

Next, as illustrated in FIG. 8, an insulation layer 18 may be stacked over the substrate 10 and the wafer substrate 16 (S51). Here, the insulation layer 18 can be made from a bond film or PPG (polypropylene glycol).

Figure 9:
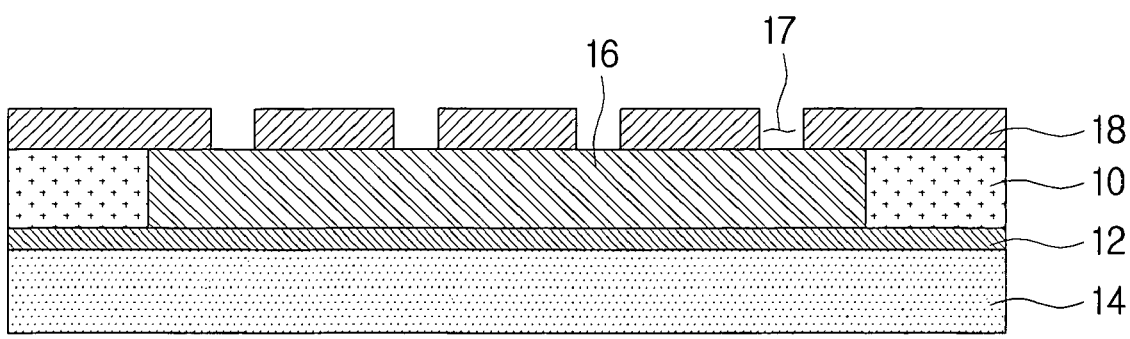
Figure 10:
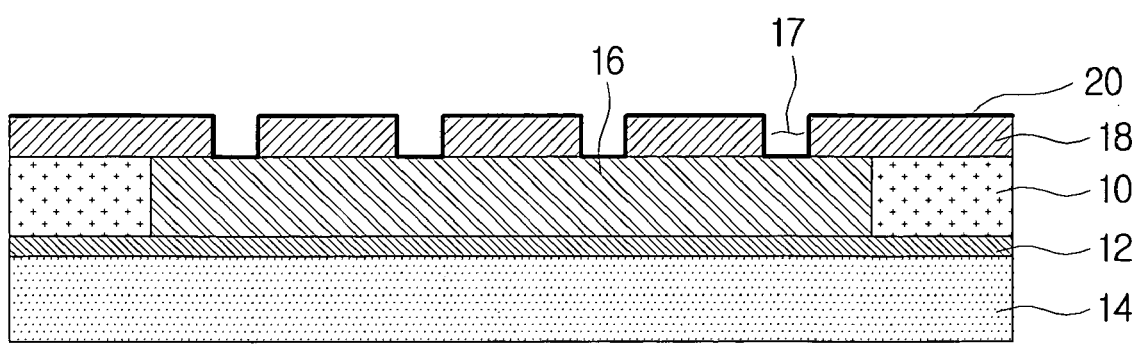
Figure 11:
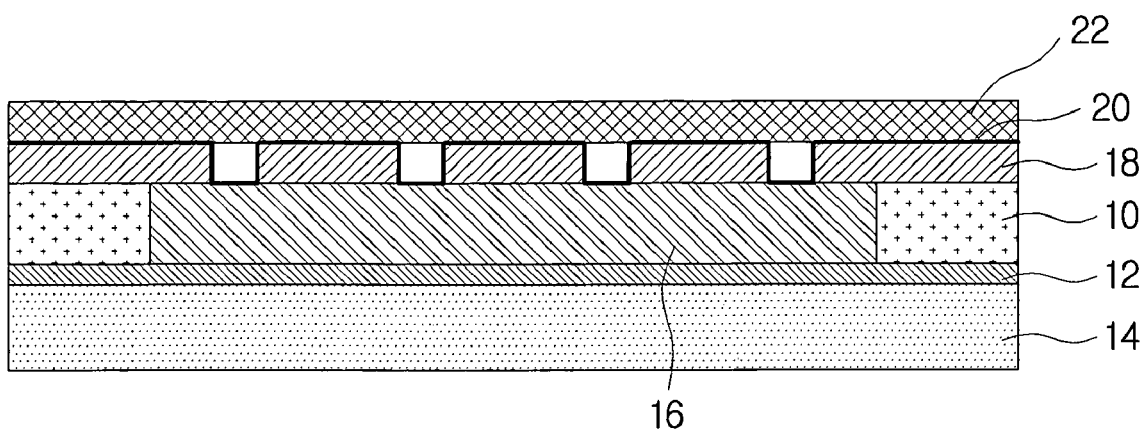
Figure 12:
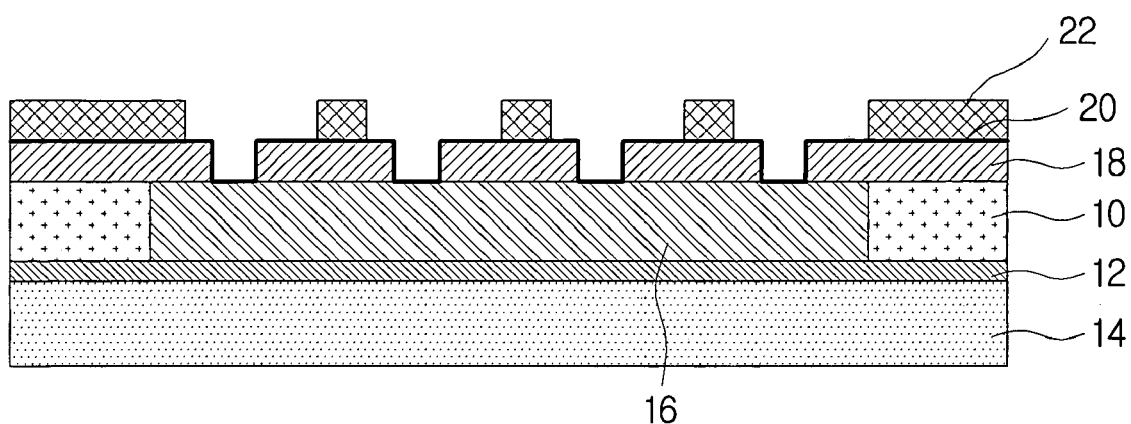

Then, as illustrated in FIG. 9, a plurality of via holes 17 may selectively be processed in the insulation layer 18 (S52), and as illustrated in FIG. 10, a seed layer 20 may be formed in the insulation layer 18 in which the via holes 17 are processed (S53). Also, as illustrated in FIG. 11 and FIG. 12, a plating resist 22 may be stacked over the seed layer 20, and the plating resist 22 may be selectively removed to correspond with the redistribution pattern 24, which will be described later in more detail (S54). The plating resist 22 can be, for example, dry film.

Figure 13:
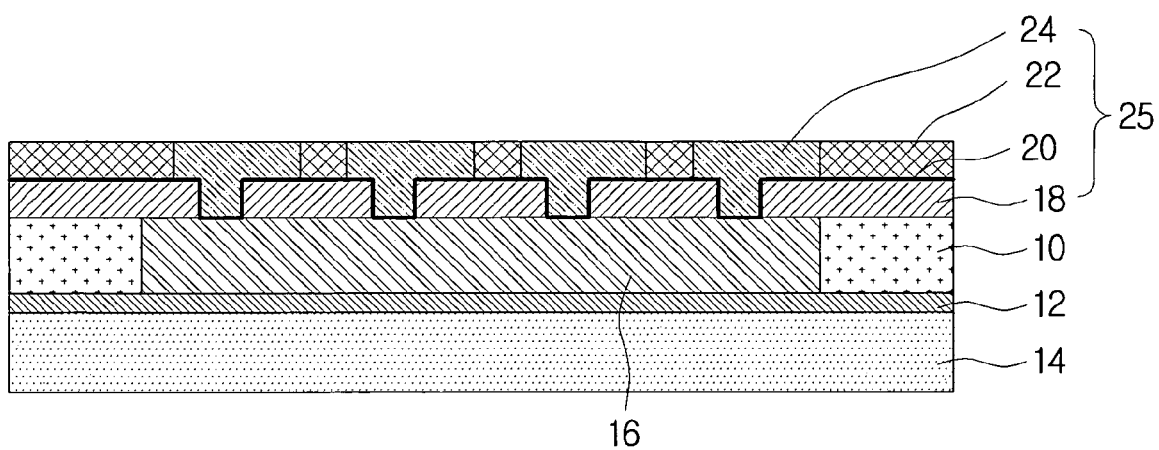

As illustrated in FIG. 13, a redistribution pattern 24 may be formed by performing electroplating over the seed layer 20, which has been exposed by selectively removing the plating resist 22 (S55). In this way, a redistribution layer 25, in which the redistribution pattern 24 including terminals for connecting to the exterior are formed, can be formed on the wafer substrate 16 (S50).

That is, a redistribution layer 25 may be formed, which has a redistribution pattern 24 for redistributing the electrical contacts of the wafer substrate 16 to more desirable positions.

Figure 14:
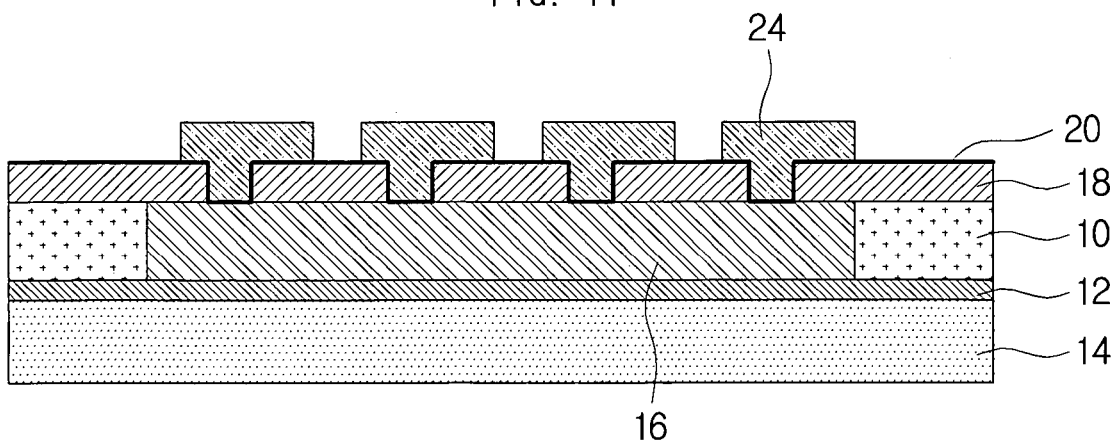

Next, as illustrated in FIG. 14, the plating resist 22 may be removed (S60), to expose the redistribution pattern 24. Here, the exposed redistribution pattern 24 can be formed in the shape of the letter "T," to alter the positions of electrical contact on the wafer substrate 16.

Figure 15:
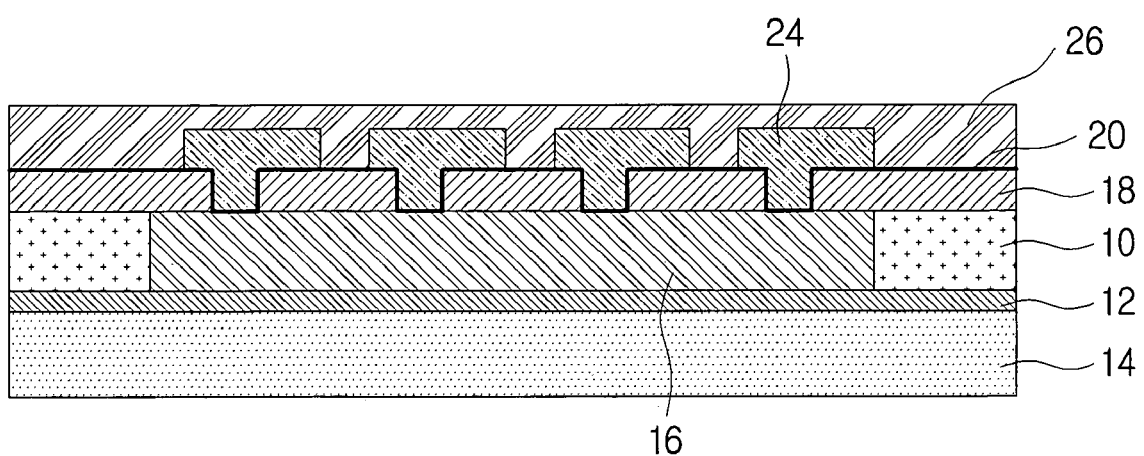
Figure 16:
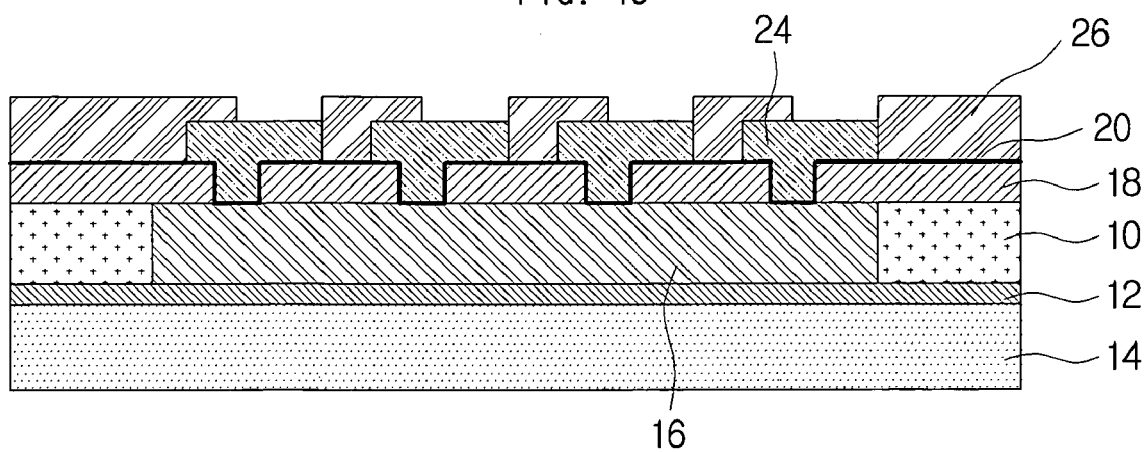

Then, as illustrated in FIG. 15, a PSR (photoimageable solder resist) ink 26 may be coated in a manner such that the redistribution pattern 24, which includes the exposed seed layer 20 and terminals, is covered (S70). Also, as illustrated in FIG. 16, the PSR ink 26 may be selectively removed such that the terminals are exposed (S80). Here, the terminals refer to exposed portions of the redistribution pattern 24 interposed between the PSR ink 26. The conductive balls 30, which will be described later in more detail, may be coupled to the terminals.

Figure 17:
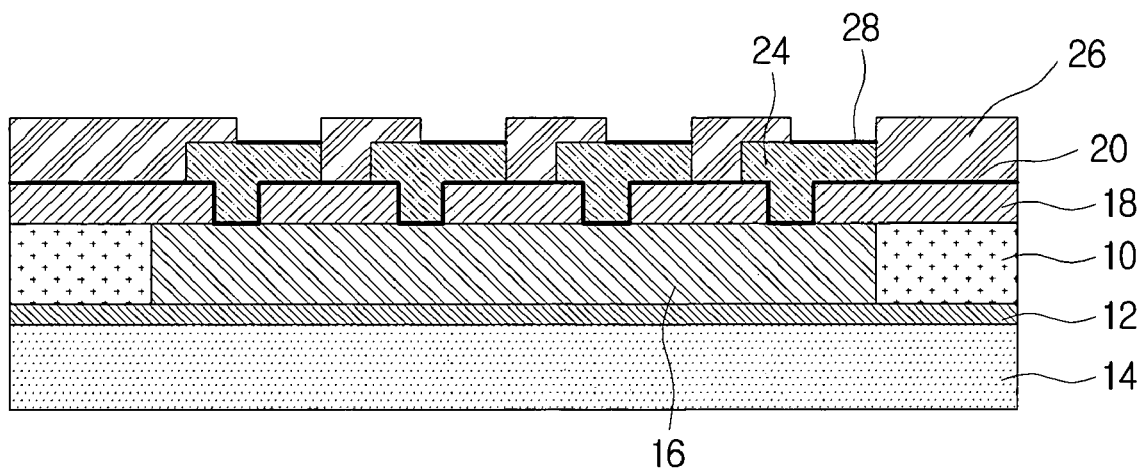
Figure 18:
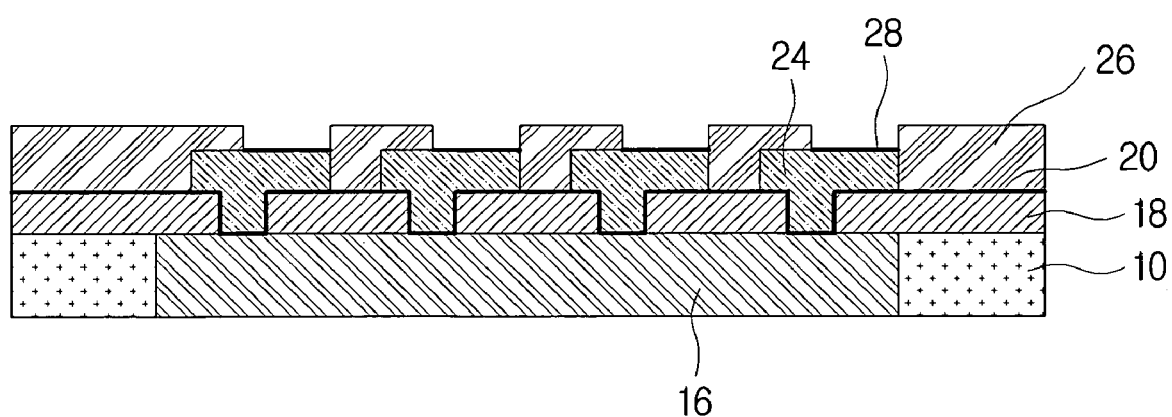
Figure 19:
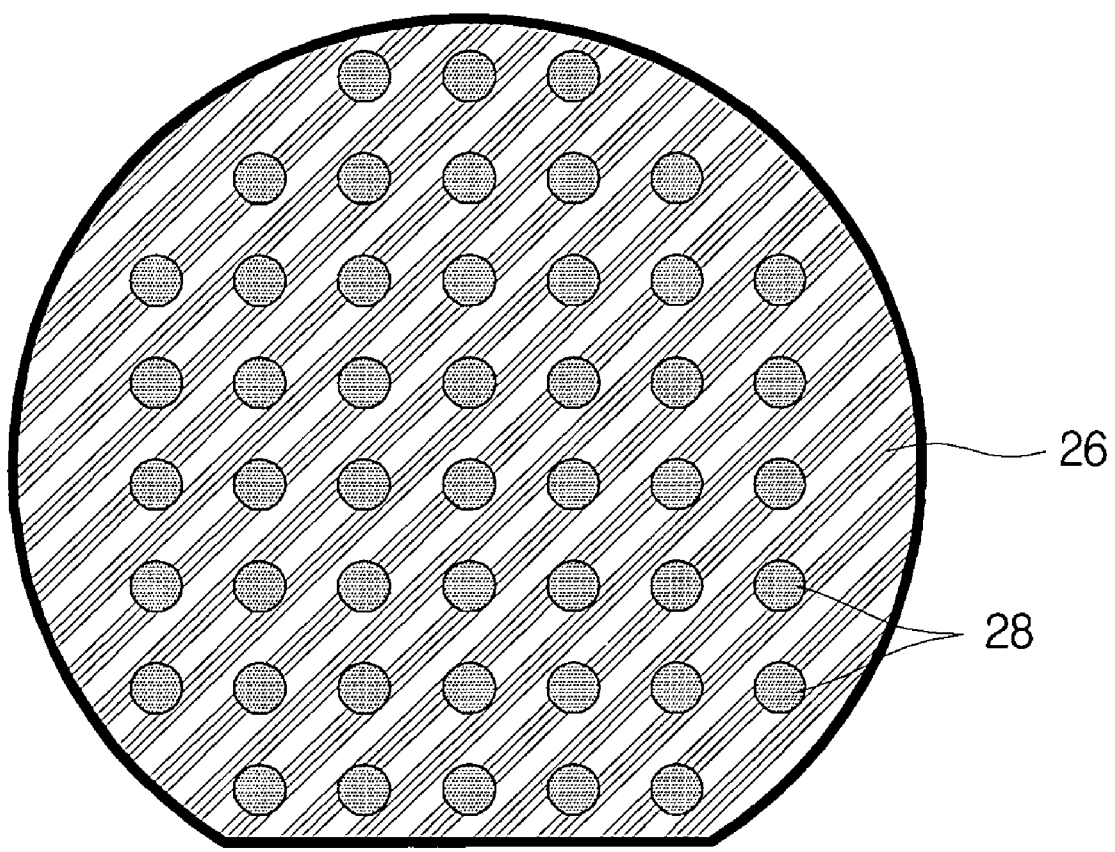

As the redistribution pattern 24 may be a metal layer formed by plating, problems of oxidation may occur if the redistribution pattern 24 is exposed to air. To prevent this, a passivation layer 28 that protects the terminals from oxidation may be formed over the terminals (S90), as illustrated in FIG. 17. The passivation layer 28 can be treated with ENIG (electroless nickel immersion gold) plating or OSP (organic solderabilty preservatives). Next, as illustrated in FIG. 18, the adhesion layer 12 and the carrier layer 14 can be separated (S100), and as illustrated in FIG. 19, the areas of the substrate 10 excluding the shapes of the cavities 11 can be removed by routing. FIG. 19 is a plan view after routing the substrate 10 to the shape of the wafer substrate 16. In this way, a wafer level package can be manufactured that fits the size of the wafer substrate 16.

Figure 20:
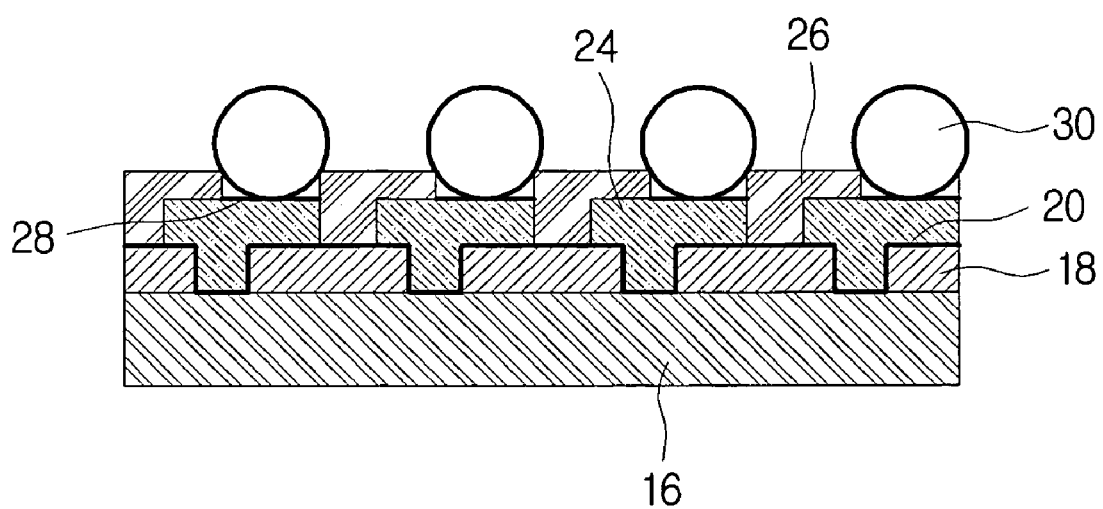
Figure 21:
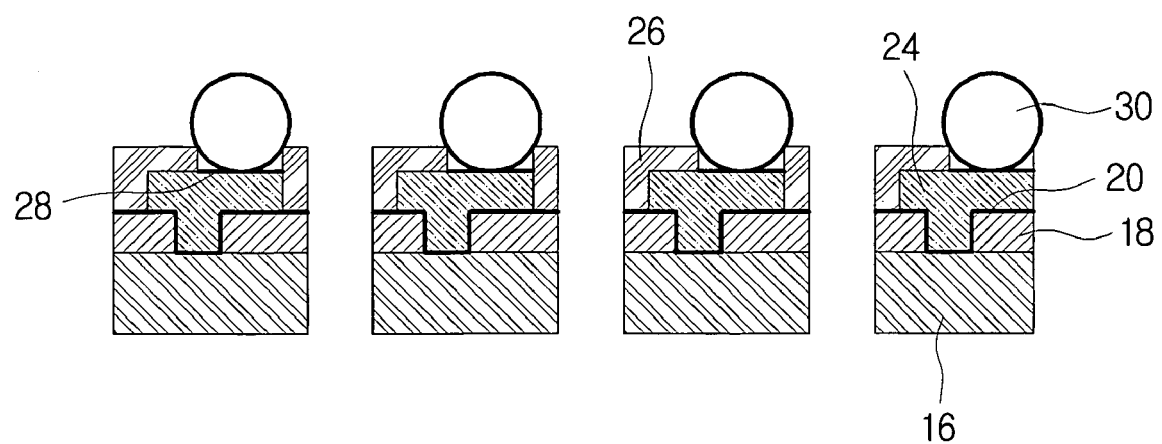

Next, as illustrated in FIG. 20, conductive balls 30 may be coupled to the terminals (S110). As illustrated in FIG. 21, the wafer to which the conductive balls 30 are coupled can be diced to a designed size.

In a conventional method of manufacturing a wafer level package according to the related art, the multiple redistribution layers are formed by applying semiconductor processes to multiple layers, so that high costs may be incurred. In the process for manufacturing a wafer level package according to this embodiment, however, the first wafer substrate can be formed using a semiconductor process, and the second redistribution layer onwards can be formed using a PCB process, so that the manufacturing costs can be lowered, and the stability and efficiency of the process can be improved.

Also, by attaching many wafers onto a substrate, productivity can be improved.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

What is claimed is:

1. A method of manufacturing a wafer level package, the method comprising:
    stacking an insulation layer over a wafer substrate;
    processing a via hole in the insulation layer;
    forming a seed layer over the insulation layer;
    forming a plating resist over the seed layer, the plating resist being in a corresponding relationship with a redistribution pattern;
    forming the redistribution pattern by electroplating, the redistribution layer comprising a terminal for external contact; and
    coupling a conductive ball to the terminal.

2. The method of claim 1, further comprising, before the stacking of the insulation layer:
    penetrating a substrate such that a cavity is formed;
    attaching an adhesion layer onto one side of the substrate; and
    placing the wafer substrate on one side of the adhesion layer by inserting the wafer substrate in the cavity.

3. The method of claim 2, further comprising, after the attaching of the adhesion layer:
    forming a carrier layer on the other side of the adhesion layer.

4. The method of claim 1, further comprising, after the forming of the redistribution pattern:
    removing the plating resist;
    coating a PSR (photoimageable solder resist) ink such that the insulation layer and the redistribution pattern including the terminal are covered; and
    selectively removing the PSR such that the terminal is exposed.

5. The method of claim 4, further comprising, before the coupling of the conductive ball:
    forming a passivation layer over the terminal, the passivation layer configured to prevent an oxidation of the terminal.

6. The method of claim 3, further comprising, before the coupling of the conductive ball:
    separating the adhesion layer and the carrier layer.

* * * * *